US010589732B2

(12) United States Patent
Ohkawa et al.

(10) Patent No.: US 10,589,732 B2
(45) Date of Patent: Mar. 17, 2020

(54) BATTERY CONTROL DEVICE AND VEHICLE SYSTEM

(71) Applicant: HITACHI AUTOMOTIVE SYSTEMS, LTD., Ibaraki (JP)

(72) Inventors: Keiichiro Ohkawa, Hitachinaka (JP); Ryohhei Nakao, Hitachinaka (JP)

(73) Assignee: VEHICLE ENERGY JAPAN INC., Ibaraki (JP)

( * ) Notice: Subject to any disclaimer, the term of this patent is extended or adjusted under 35 U.S.C. 154(b) by 225 days.

(21) Appl. No.: 15/555,171

(22) PCT Filed: Feb. 26, 2016

(86) PCT No.: PCT/JP2016/055738
§ 371 (c)(1),
(2) Date: Sep. 1, 2017

(87) PCT Pub. No.: WO2016/140148
PCT Pub. Date: Sep. 9, 2016

(65) Prior Publication Data
US 2018/0050681 A1 Feb. 22, 2018

(30) Foreign Application Priority Data

Mar. 2, 2015 (JP) .................................. 2015-039998

(51) Int. Cl.
B60W 20/13 (2016.01)
H02J 7/00 (2006.01)
(Continued)

(52) U.S. Cl.
CPC ............. B60W 20/13 (2016.01); B60L 58/12 (2019.02); B60W 10/06 (2013.01); B60W 10/08 (2013.01);
(Continued)

(58) Field of Classification Search
CPC ...... B60W 20/13; B60W 10/06; B60W 10/08; B60W 10/26; B60W 20/40;
(Continued)

(56) References Cited

U.S. PATENT DOCUMENTS 6,018,694 A * 1/2000 Egami ...................... B60K 6/24
701/102
9,026,389 B2 * 5/2015 Shigemizu .......... G01R 31/3828
702/63
(Continued)

FOREIGN PATENT DOCUMENTS

EP 2246956 A1 11/2010
EP 2667211 A1 11/2013
(Continued)

OTHER PUBLICATIONS

Extended European Search Report dated Sep. 24, 2018 for the European Patent Application No. 16758842.5.
(Continued)

Primary Examiner — Angelina Shudy
(74) Attorney, Agent, or Firm — Volpe and Koenig, P.C.

(57) ABSTRACT

A device for controlling current for charging/discharging a battery with a high accuracy includes a time-point setting unit which calculates a voltage difference by subtracting a calculated open-circuit voltage from a measured closed-circuit voltage, and sets first and second time points, at which an absolute value of the voltage difference becomes equal to or less than a predetermined value and an absolute value of a difference in the open-circuit voltage becomes equal to or less than a predetermined value. The control device further includes a current correction amount calculation unit to obtain the current integral amount, calculate the current error in a detection signal and set the current error as the current correction amount on the basis of the current integral amount and the time from the first time point
(Continued)

to the second time point. The current correction unit corrects the detection signal using the current correction amount.

16 Claims, 10 Drawing Sheets

(51) Int. Cl.
H01M 10/48 (2006.01)
G01R 31/3842 (2019.01)
G01R 31/3828 (2019.01)
G01R 31/3835 (2019.01)
B60L 58/12 (2019.01)
B60W 10/06 (2006.01)
B60W 10/08 (2006.01)
B60W 10/26 (2006.01)
B60W 20/40 (2016.01)

(52) U.S. Cl.
CPC ............ *B60W 10/26* (2013.01); *B60W 20/40* (2013.01); *G01R 31/3828* (2019.01); *G01R 31/3835* (2019.01); *G01R 31/3842* (2019.01); *H01M 10/48* (2013.01); *H02J 7/00* (2013.01); B60L 2240/545 (2013.01); B60L 2240/547 (2013.01); B60L 2240/549 (2013.01); B60L 2260/42 (2013.01); B60W 2510/244 (2013.01); Y02T 10/705 (2013.01); Y02T 10/7005 (2013.01); Y02T 10/7044 (2013.01); Y10S 903/93 (2013.01)

(58) Field of Classification Search
CPC ............ G01R 31/3835; G01R 31/3828; G01R 31/3842; B60L 58/12; B60L 2240/545; B60L 2240/547; B60L 2240/549; B60L 2260/42; B60L 2510/244; H01M 10/48; H02J 7/00; Y02T 10/7005; Y02T 10/7044; Y02T 10/705; Y10S 903/93
USPC .......................................................... 701/22
See application file for complete search history.

(56) References Cited

U.S. PATENT DOCUMENTS

| 10,266,063 | B2* | 4/2019 | Ohkawa | ................. G01R 31/36 |
| 2008/0238371 | A1* | 10/2008 | Tamezane | .......... G01R 31/3828 |
| | | | | 320/134 |
| 2012/0306450 | A1* | 12/2012 | Nakayama | .............. G06F 1/263 |
| | | | | 320/134 |
| 2015/0127280 | A1 | 5/2015 | Baba et al. | |
| 2015/0346285 | A1* | 12/2015 | Igarashi | ................. B60L 58/16 |
| | | | | 324/432 |

FOREIGN PATENT DOCUMENTS

| JP | 2006-017682 A | 1/2006 |
| JP | 2010-203854 A | 9/2010 |
| WO | 2013/047400 A1 | 4/2013 |
| WO | 2013/168349 A1 | 11/2013 |

OTHER PUBLICATIONS

International Search Report for WO 2016/140148 A1, dated May 17, 2016.

* cited by examiner

BATTERY CONTROL DEVICE AND VEHICLE SYSTEM

TECHNICAL FIELD

The present invention relates to a battery control device and a vehicle system equipped with the battery control device.

BACKGROUND ART

A battery control device is provided with a current detection unit to read a charging/discharging current of a battery as disclosed in PTL 1 for example. In general, a reading error of the current is contained in a detection value of the current detection unit, and the reading error causes a temporal integral error in a temporal integral value of the charging/discharging current.

As a method of obtaining and correcting the temporal integral error, the following method is used. Two time points having an equal SOC are selected from among battery states at the time of charging/discharging. The temporal integral value of the charging/discharging current between the two time points is obtained. Since the SOC is equal, the temporal integral value of the charging/discharging current becomes zero if there is no reading error of the current detection unit. If there is a reading error of the current detection unit, the temporal integral value of the charging/discharging current does not become zero. Then, the non-zero temporal integral value is a temporal integral error in the temporal integral value of the charging/discharging current. The temporal integral error is obtained by temporally integrating the reading error of the current detection unit. The reading error of the current is obtained by dividing the temporal integral error by a time between the two time points. When the reading error of the obtained current detection unit is used as a current correction amount and subtracted from the reading value of the current detection unit, the charging/discharging current value having no error is obtained.

CITATION LIST

Patent Literature

PTL 1: JP 2010-203854 A

SUMMARY OF INVENTION

Technical Problem

In the method of obtaining the correction value, as described above, it is necessary to obtain two time points having an equal SOC, but there is a problem in probability of equality of the SOC.

Solution to Problem (1) A battery control device according to a preferable aspect of the present invention includes a current detection unit that detects a current flowing through a secondary battery, a closed-circuit voltage detection unit that detects an inter-terminal voltage of the secondary battery to acquire a closed-circuit voltage, an open-circuit voltage calculation unit that performs calculation on the basis of the closed-circuit voltage to acquire an open-circuit voltage, a time-point setting unit that calculates each voltage difference obtained by subtracting the open-circuit voltage from the closed-circuit voltage, and sets a first time point and a second time point at which an absolute value of the voltage difference is equal to or less than a predetermined value and an absolute value of a difference of the open-circuit voltage becomes equal to or less than a predetermined value, a current integral amount calculation unit that obtains a current integral amount, the current integral amount being a time integral amount of a current flowing through the secondary battery between the first time point and the second time point, a current correction amount calculation unit that calculates a current error contained in a detection signal output from the current detection unit on the basis of the current integral amount and a time from the first time point to the second time point, and sets the current error as a current correction amount, and a current correction unit that performs correction on the detection signal using the current correction amount.

(2) A battery control device according to another preferable aspect of the present invention includes a current detection unit that detects a current flowing through a secondary battery, a closed-circuit voltage detection unit that detects an inter-terminal voltage of the secondary battery to acquire a closed-circuit voltage, an open-circuit voltage calculation unit that performs calculation on the basis of the closed-circuit voltage to acquire an open-circuit voltage, a time-point setting unit that calculates each voltage difference obtained by subtracting the open-circuit voltage from the closed-circuit voltage, and sets a first time point and a second time point at which an absolute value of the voltage difference becomes equal to or less than a predetermined value, a current integral amount calculation unit that obtains a current integral amount, the current integral amount being a time integral amount of a current flowing through the secondary battery between the first time point and the second time point, an SOC difference calculation unit that obtains an SOC difference between an SOC at the first time point and an SOC at the second time point, a current correction amount calculation unit that calculates a current error contained in a detection signal output by the current detection unit on the basis of a storage battery capacity, the SOC difference, the current integral amount, and a time from the first time point to the second time point, and sets the current error as a current correction amount, and a current correction unit that performs correction on the detection signal using the current correction amount.

(3) A vehicle system according to a preferable aspect of the present invention includes an engine, a motor generator which is driven by power from a secondary battery at the time of powering and generates regenerative electric power to charge the secondary battery at the time of regenerating, the battery control device according to the preferred aspect of the invention, and a system control unit which controls at least the engine and the motor generator. The engine and the motor generator are driven by a drive system. The system control unit includes an EV driving mode in which the drive system is driven by the motor generator without using the engine, and an HEV driving mode in which the drive system is driven by the engine and the motor generator.

Advantageous Effects of Invention

According to the invention, it is possible to obtain a charging/discharging current with a high accuracy.

DESCRIPTION OF EMBODIMENTS

—First Embodiment—

Figure 1:
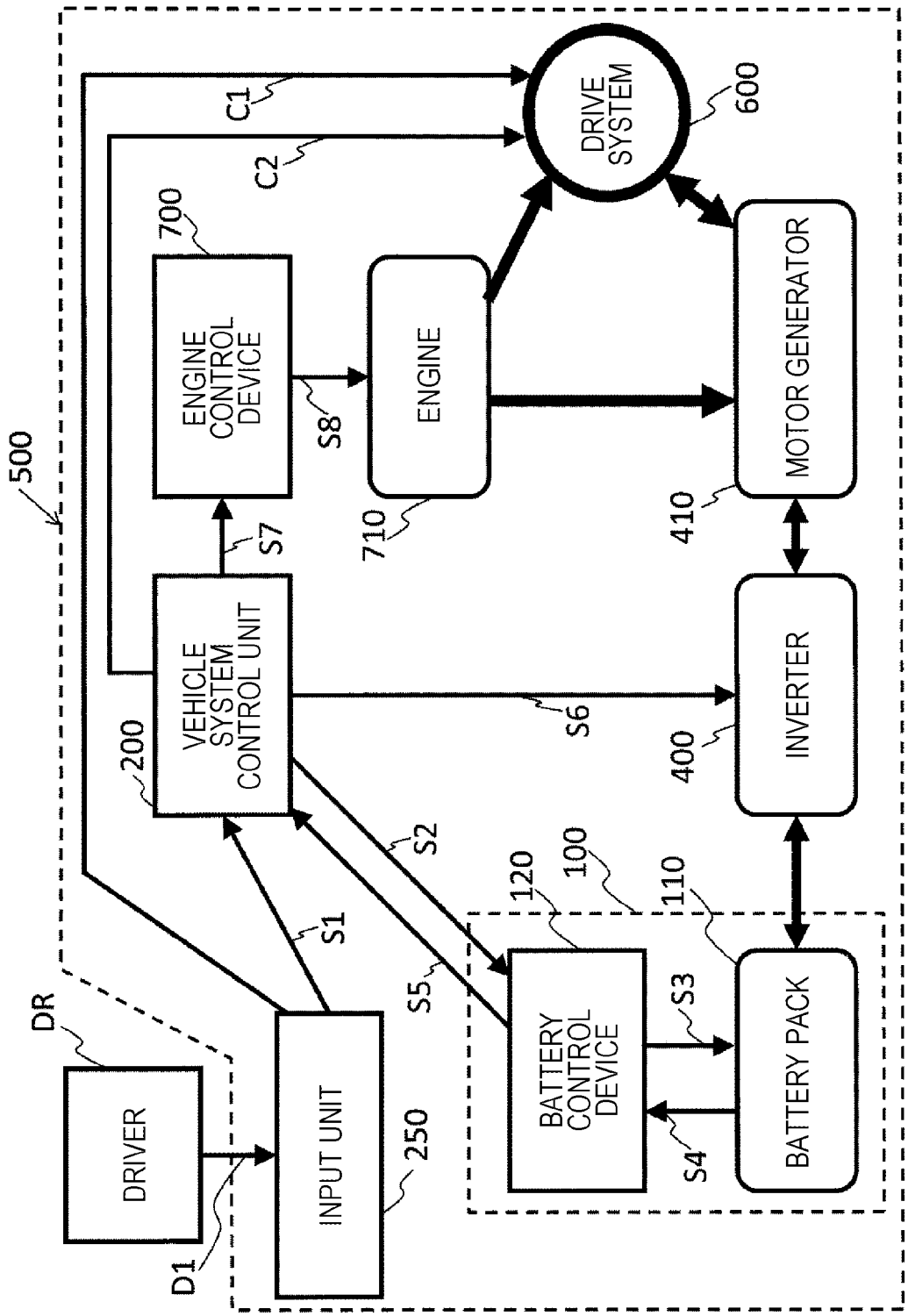
FIG. 1 is a diagram illustrating a vehicle system.

FIG. 1 is a diagram illustrating a vehicle system 500 of this embodiment. The vehicle system 500 is a so-called parallel-type hybrid system. The vehicle system 500 include a drive system 600, an engine 710, an engine control device 700, a motor generator 410, an inverter 400, a battery system 100 which includes a battery pack 110 and a battery control device 120, an input unit 250, and a vehicle system control unit 200.

A driver DR illustrated in FIG. 1 directly issues an operation command to the vehicle system through the input unit 250. The input unit 250 is configured by an accelerator pedal, a brake pedal, a handle, and an input device to start or stop the vehicle system 500. When an operation command D1 is input from the driver DR, the input unit 250 outputs a signal S1 to the vehicle system control unit 200 in response to the operation command D1. The signal S1 is especially output with respect to the accelerator pedal and the brake pedal in the configuration of the input unit 250.

The vehicle system control unit 200 controls the engine control device 700, the battery control device 120, and the inverter 400 on the basis of the signal S1 output from the input unit 250. For the control, the vehicle system control unit 200 outputs a signal S2 to the battery control device 120, a signal S6 to the inverter 400, and a signal S7 to the engine control device 700. The vehicle system control unit 200 determines a distribution of a drive power output from the motor generator 410 to the drive system 600 and a drive power output from the engine 710 to the drive system 600 according to a running state.

The battery system 100 includes the battery pack 110 configured by cells 111 (FIG. 2) of a secondary battery and the battery control device 120. At the time of powering of the motor generator 410, the battery pack 110 is discharged, and the power is supplied to the motor generator 410 through the inverter 400. In addition, at the time of regenerating of the motor generator 410, the battery pack 110 is charged through the inverter 400 using the power output from the motor generator 410. The configuration of the battery system 100 will be described in detail below. The battery control device 120 performs various types of controls of the battery pack 110 on the basis of a signal S4 which is output from the battery pack 110 and contains various types of information of the battery pack 110.

The inverter 400 is provided between the battery pack 110 and the motor generator 410 and controls a current flowing between the battery pack 110 and the motor generator 410 on the basis of the signal S6.

The motor generator 410 converts electric energy from the battery pack 110 into dynamic energy, and outputs the dynamic energy to the drive system 600. In addition, as described above, since the vehicle system 500 is a parallel-type hybrid system, the motor generator 410 converts the dynamic energy from the drive system 600 or the engine 710 into the electric energy, and outputs the electric energy to the battery pack 110. The dynamic energy is supplied from the drive system 600 to the motor generator 410 when the driver DR depresses the brake pedal of the input unit 250 to stop the drive system 600. The dynamic energy is supplied from the engine 710 to the motor generator 410 when an SOC of the battery pack 110 is controlled to fall within a predetermined range in a case where the SOC of the battery pack 110 is less than the predetermined range. Specifically, when monitoring the battery pack 110 and determining that the SOC of the battery pack 110 is less than a predetermined range, the battery control device 120 controls the engine control device 700 through the vehicle system control unit 200 to supply the dynamic energy from the engine 710 to the motor generator 410.

The engine control device 700 outputs a signal S8 to the engine 710 on the basis of the signal S7 from the vehicle system control unit 200, and controls the engine 710.

The engine 710 performs ignition, intake/exhaust, and a valve operation on the basis of the signal S8. Therefore, the engine 710 can obtain the dynamic energy, that is, a drive power. The obtained drive power is output to the drive system 600 or the motor generator 410.

The drive system 600 includes a wheel, a drive shaft, a propeller, a differential gear, and a hydraulic brake, while not illustrated. The drive system 600 drives the respective configurations of the drive system 600 using the drive power from the motor generator 410 and the drive power from the engine 710, and controls the driving of the vehicle.

Further, a path through the engine 710 and the motor generator 410 is not the only input path of the operation command D1 from the input unit 250 to the drive system 600. As another input path, a path C1 through which the operation command is directly input from the input unit to the drive system 600 (for example, an input path from the brake pedal to the hydraulic brake) may be considered. In addition, there may be considered a path C2 through which the operation command D1 is directly input from the vehicle system control unit 200 to the drive system 600 through another control system such as an electric power steering device after the operation command D1 is input from the input unit 250 to the vehicle system control unit 200. However, such a configuration is not related to the battery system 100 of this embodiment, and thus the description will be omitted.

Figure 2:
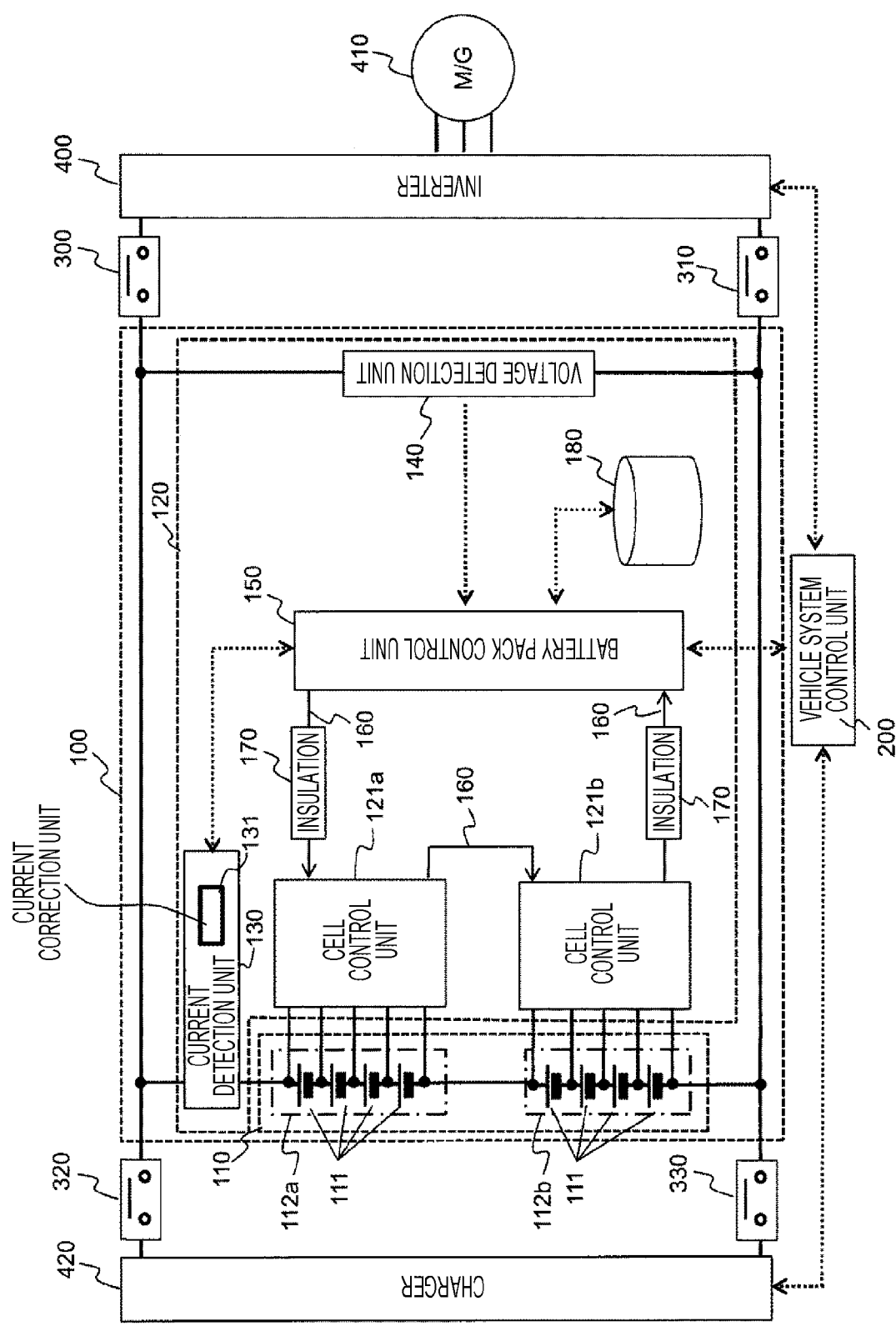
FIG. 2 is a diagram illustrating a battery control device and a peripheral configuration.

FIG. 2 is a diagram illustrating the battery system 100 of the battery control device 120 and a peripheral configuration. The battery system 100 is connected to the inverter 400 through relays 300 and 310. The battery system 100 includes the battery pack 110 and the battery control device 120. The battery control device 120 includes cell control units 121a and 121b, a current detection unit 130, a voltage detection unit 140, a battery pack control unit 150, and a storage unit 180.

The battery pack 110 is configured by electrically connecting a plurality of cells 111 in series which are able to accumulate and transfer (charging/discharging of DC power) of the electric energy. The cells 111 of the battery pack 110 are divided into groups in a predetermined unit in order to manage/control the state. The divided respective cells 111 are electrically connected in series to form a cell group 112. The battery pack 110 of this embodiment includes the plurality of cell groups 112, that is, cell groups 112a and 112b. Further, the number of cells 111 of the cell group 112 may be the same in all the cell groups 112. The number of cells 111 may be different in every cell group 112. In this embodiment, the battery pack 110 is configured to include eight cells 111 in total such that the cell groups 112a and 112b each are configured by electrically connecting four cells 111 in series as illustrated in FIG. 2, and these cell groups 112a and 112b are further electrically connected in series in order to simplify the description.

The cell control units 121a and 121b are respectively connected to the cell groups 112a and 112b to detect cell voltages (voltages between both ends) and temperatures of the respective cells 111 of these cell groups, and transmit signals indicating the detection results to the battery pack control unit 150 through a signal channel 160 and an insulating element 170. Further, a photocoupler is used as the insulating element 170 for example.

The current detection unit 130 detects the current flowing to the battery pack 110. The detected current is here called a detection current I(t). The current detection unit 130 includes a current correction unit 131. The current correction unit 131 calculates a current true value $I_{gen}$ on the basis of the detection current I(t) and a current correction amount $I_{err}$ obtained from the battery pack control unit 150. The current detection unit 130 outputs the detection current I(t) and the current true value $I_{gen}$ to the battery pack control unit 150.

The voltage detection unit 140 detects a voltage between both ends of the battery pack 110, that is, a total voltage of the cells 111 connected in series in the battery pack 110.

The battery pack control unit 150 performs various types of processes and calculations to control the battery pack 110 using the information acquired from the cell control units 121a and 121b, the current detection unit 130, the voltage detection unit 140, and the vehicle system control unit 200, and the information stored in the storage unit 180. For example, an SOC, a storage battery capacity, and an SOHQ of each cell 111 are calculated. The details will be described in the explanation of FIG. 4. Then, information required for the control of the battery pack 110 is output to the cell control units 121a and 121b and the vehicle system control unit 200 on the basis of these calculation results.

Herein, the description will be given about a communication method between the battery pack control unit 150 and the cell control units 121a and 121b. The cell control units 121a and 121b are connected in series in a descending order of the potentials of the cell groups 112a and 112b which are monitored respectively. The signal transmitted from the battery pack control unit 150 is input to the cell control unit 121a through the insulating element 170 and the signal channel 160. The output of the cell control unit 121a is input to the cell control unit 121b through the signal channel 160. The output of the cell control unit 121b at the lowest level is transferred to the battery pack control unit 150 through the insulating element 170 and the signal channel 160. Further, in this embodiment, there is no insulating element between the cell control unit 121a and the cell control unit 121b, but a signal can be transmitted/received therebetween through the insulating element.

The storage unit 180 stores various types of information required for the battery pack control unit 150 to control the battery pack 110. For example, the information related to the SOC of each cell 111 and the information related to the storage battery capacity of a newly-released cell 111 are stored in the storage unit 180. Examples of information include an internal resistance Ro, an electrostatic capacitance C, and an internal resistance Rp, and the details thereof will be described below again.

The vehicle system control unit 200 controls the inverter 400 connected to the battery system 100 through the relays 300 and 310 using the information transmitted from the battery pack control unit 150. During a period when the vehicle runs, the battery system 100 is connected to the inverter 400. The inverter 400 drives the motor generator 410 using the electric energy which is accumulated in the battery pack 110 in the battery system 100.

In a case where the vehicle system 500 equipped with the battery system 100 starts to run, the battery system 100 is connected to the inverter 400 under the management of the vehicle system control unit 200. Then, the motor generator 410 is driven by the inverter 400 using the energy accumulated in the battery pack 110. On the other hand, the battery pack 110 is charged with the power generated by the motor generator 410 at the time of regenerating.

When the battery system 100 is connected to a charger 420 through the relays 320 and 330, the battery pack 110 is charged with the charging current supplied from the charger 420 until a predetermined condition is satisfied. The charged energy accumulated in the battery pack 110 is used at the next running timing of the vehicle, and also used to operate electric components besides the vehicle. Further, the energy may be discharged even to an external power source which is represented as a household power source as needed. Further, the charger 420 may be an on-vehicle charger mounted in the vehicle, or may be mounted in an external power source which is represented as a charging stand. When the vehicle equipped with the battery system 100 is connected to these power sources, the battery system 100 and the charger 420 are connected on the basis of the information transmitted from the vehicle system control unit 200.

Figure 3:
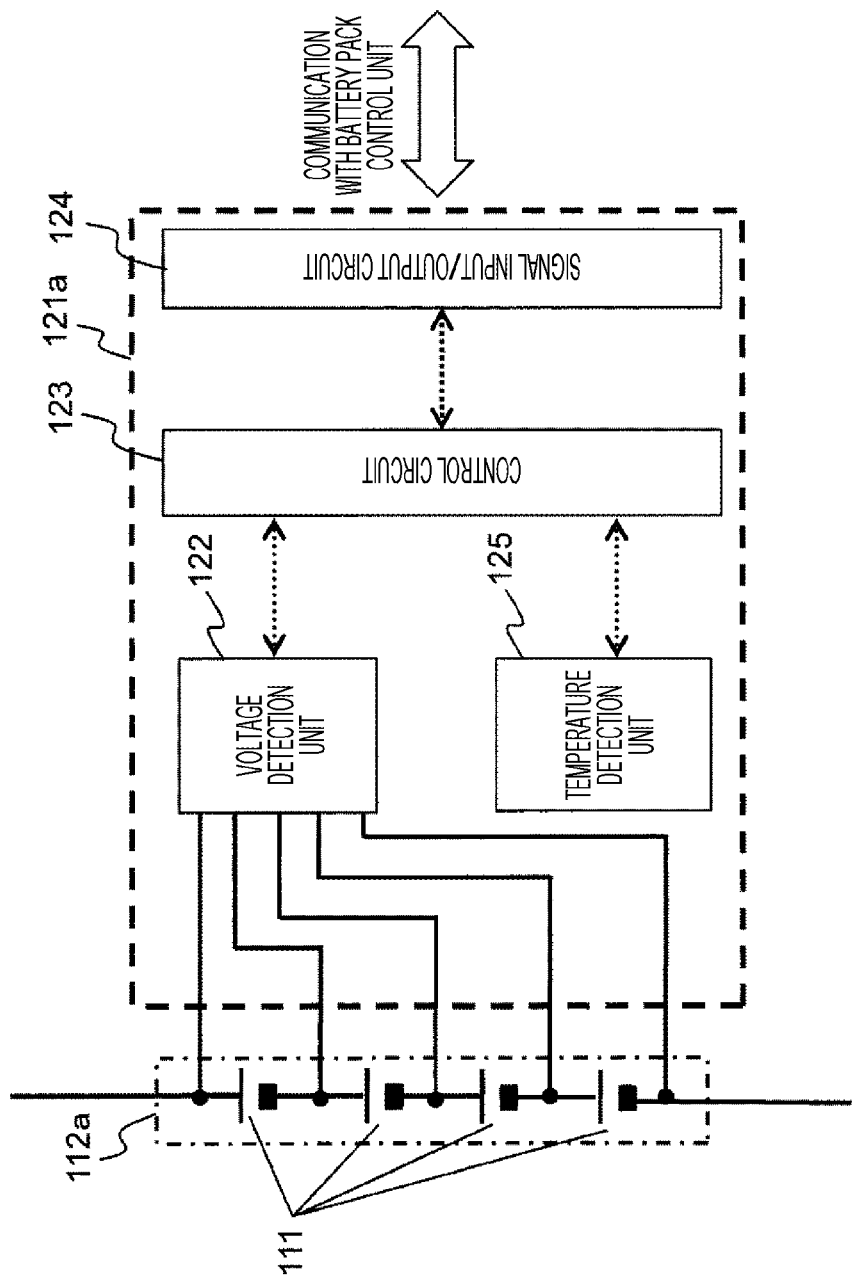
FIG. 3 is a diagram illustrating a cell and a cell control unit.

FIG. 3 is a diagram illustrating a circuit configuration of the cell control unit 121a. As illustrated in FIG. 3, the cell control unit 121a includes a voltage detection unit 122, a control circuit 123, a signal input/output circuit 124, and a temperature detection unit 125. Further, the cell control unit 121a and the cell control unit 121b of FIG. 2 have the same circuit configuration. Therefore, the circuit configuration of the cell control unit 121a is illustrated as a representative of these units in FIG. 3.

The voltage detection unit 122 measures inter-terminal voltages (voltages between both ends) of the respective cells 111. The control circuit 123 acquires the measurement results from the voltage detection unit 122 and the temperature detection unit 125, and transmits the results to the battery pack control unit 150 through the signal input/output circuit 124. Further, while not illustrated in FIG. 3, there is a well-known circuit configuration provided in the cell control unit 121a to equalize a voltage deviation which is caused between the cells 111 and the SOC according to a self-discharging and a deviation in current consumption. The operation of the circuit is controlled by the control circuit 123.

In FIG. 3, the temperature detection unit 125 has a function of measuring a temperature of the cell group 112a. The temperature detection unit 125 measures one temperature with respect to the entire cell group 112a, and uses the temperature as a representative value of the temperatures of the respective cells 111 of the cell group 112a. The measurement result of temperature of the temperature detection unit 125 is used in various types of calculations to detect the states of the cell 111, the cell group 112a, and the battery pack 110 in the battery pack control unit 150. At this time, the temperature measured by the temperature detection unit 125 is used not only as the temperature of the cell group 112a but also as the temperature of each cell 111 of the cell group 112a. Further, the temperature may be averaged on the basis of the temperature of the cell group 112a measured by the temperature detection unit 125 of the cell control unit 121a and the temperature of the cell group 112b measured by the temperature detection unit 125 of the cell control unit 121b to obtain the temperature of the battery pack 110 in the battery pack control unit 150.

Further, FIG. 3 illustrates an example in which one temperature detection unit 125 is provided in the cell control unit 121a. Besides, the temperature detection unit 125 may be provided in each cell 111 to measure the temperature of each cell 111, and the battery pack control unit 150 may perform various types of calculations on the basis of the measurement result. Alternatively, one temperature detection unit 125 may be provided with respect to the entire battery pack 110.

Further, while the temperature detection unit 125 is simply illustrated as one block in FIG. 3, a temperature sensor is provided with respect to the cell group 112a (temperature measurement target) in practice, and the temperature sensor outputs temperature information as a voltage signal. The temperature of the cell group 112a is calculated by the control circuit 123 on the basis of the voltage signal to obtain the measurement result of temperature of the cell group 112a. When the measurement result of temperature calculated by the control circuit 123 is transmitted to the signal input/output circuit 124, the signal input/output circuit 124 outputs the measurement result of temperature to the outside of the cell control unit 121a. A function of realizing such a series of processes is installed in the cell control unit 121a as the temperature detection unit 125. Further, the voltage signal output from the temperature sensor may be measured in the voltage detection unit 122.

Herein, a relation between an inter-terminal voltage V, a closed-circuit voltage (CCV), and an open-circuit voltage (OCV) of each cell 111 of the battery pack 110 in this embodiment will be described using FIGS. 4 to 6.

Figure 4:
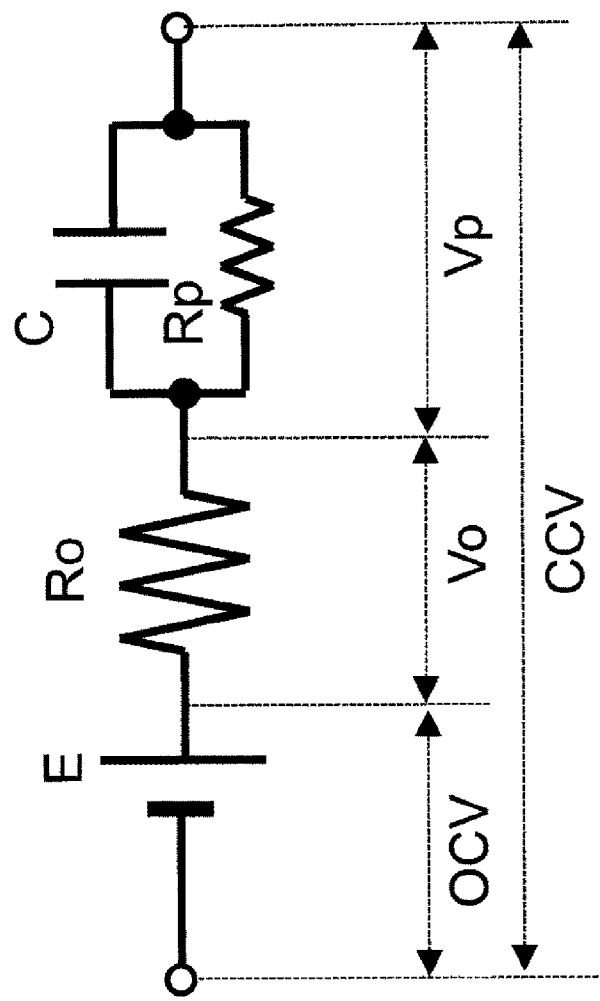
FIG. 4 is a diagram illustrating an equivalent circuit of a secondary battery.

FIG. 4 is a diagram schematically illustrating the configuration of the closed-circuit voltage (CCV) of the cell 111. The closed-circuit voltage (CCV) is configured by the open-circuit voltage (OCV), a voltage Vo, and a voltage Vp. The open-circuit voltage (OCV) is caused by an electromotive force E of the cell 111. The voltage Vo is caused by the internal resistance R0 of the cell 111. The voltage Vp is caused by the electrostatic capacitance C and the internal resistance Rp of the cell 111. In FIG. 4, the configuration causing the voltage Vp is illustrated as a parallel circuit of the electrostatic capacitance C and the internal resistance Rp for example.

FIG. 5(a) illustrates the inter-terminal voltage V of the cell 111 when the cell 111 is charged. FIG. 5(b) illustrates a charging current I.

Figure 5:
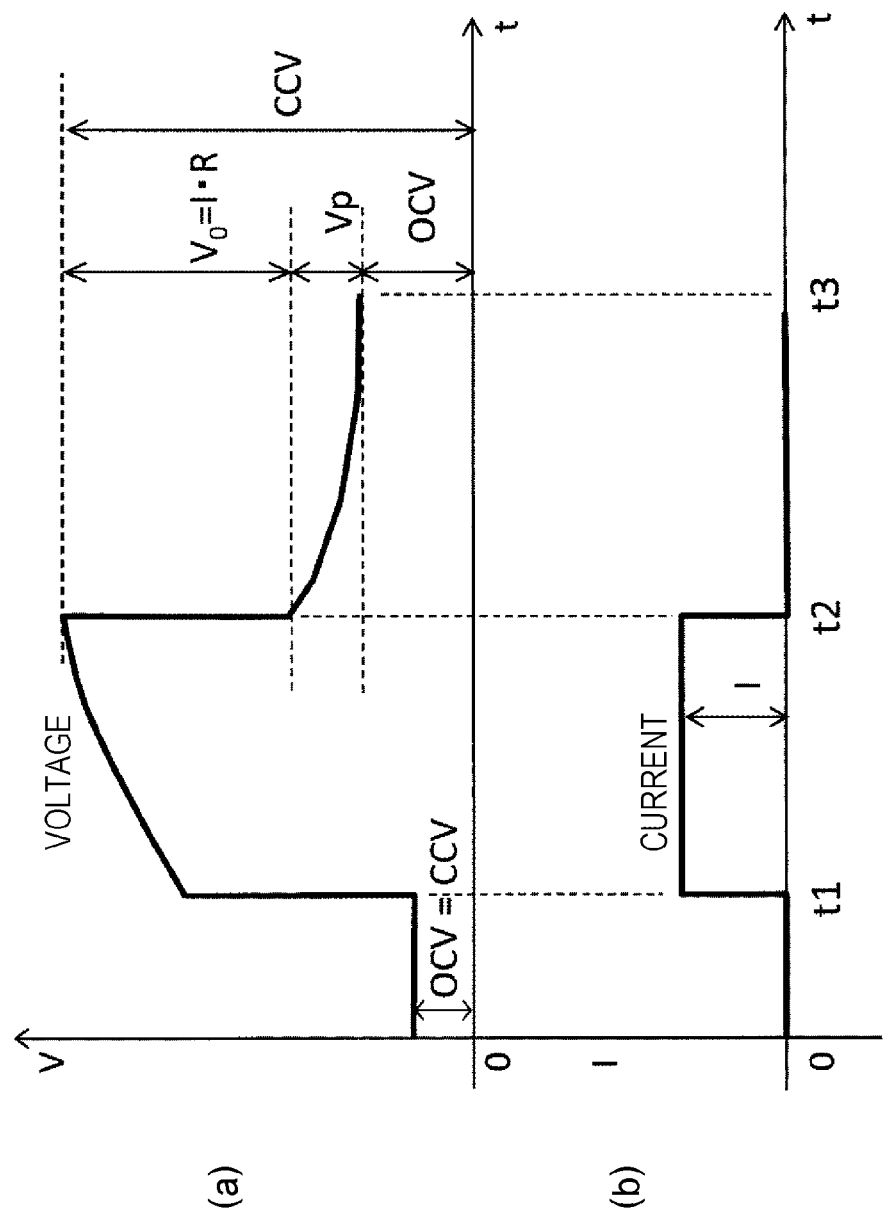
FIG. 5 is a diagram illustrating a behavior of an inter-terminal voltage at the time of charging the secondary battery.

In FIG. 5, the charging/discharging is not performed before a time t1, and the inter-terminal voltage V is stabilized. At this time, the inter-terminal voltage V is equal to the OCV. In addition, the voltage V0 and the voltage Vp are zero. Therefore, the OCV and the CCV are equal.

In FIG. 5, a period from the time t1 to a time t2 is a charging period. The current I starts to flow at the beginning time point of the charging period (that is, the time t1), and accordingly the voltage Vo (=I·R) is generated. The voltage Vp gradually increases during the charging period. The CCV on the right side of FIG. 5(a) illustrates a CCV immediately before the charging period ends.

The charging current I becomes zero at the time t2, and the charging ends. Therefore, the voltage Vo (=I·R) becomes zero at the time t2. After the time t2, the OCV and the voltage Vp form the CCV. Since the charging or the discharging does not occur after the time t2, the voltage Vp is attenuated and becomes almost zero at a time t3.

In this way, the inter-terminal voltage V is finally stabilized after the charging period and then a certain period (t2 and t3 in FIG. 5) elapse, and becomes equal to the OCV. Further, the case of the charging is illustrated as an example in FIG. 5, and the discharging is also the same. In general, since the charging and the discharging are performed almost without rest, the CCV can be detected from the inter-terminal voltage V, but the OCV cannot be detected. Then, the OCV is calculated from an expression indicating a relation illustrated in FIGS. 4 and 5 as follows:

$$OCV = CCV - Vo - Vp \quad (1)$$

In order to calculate the OCV from Expression (1), the information of the internal resistance Ro, the electrostatic capacitance C, the internal resistance Rp, the CCV, and the current I is necessary. A detailed calculation will be described below in the explanation of FIG. 7.

Figure 6:
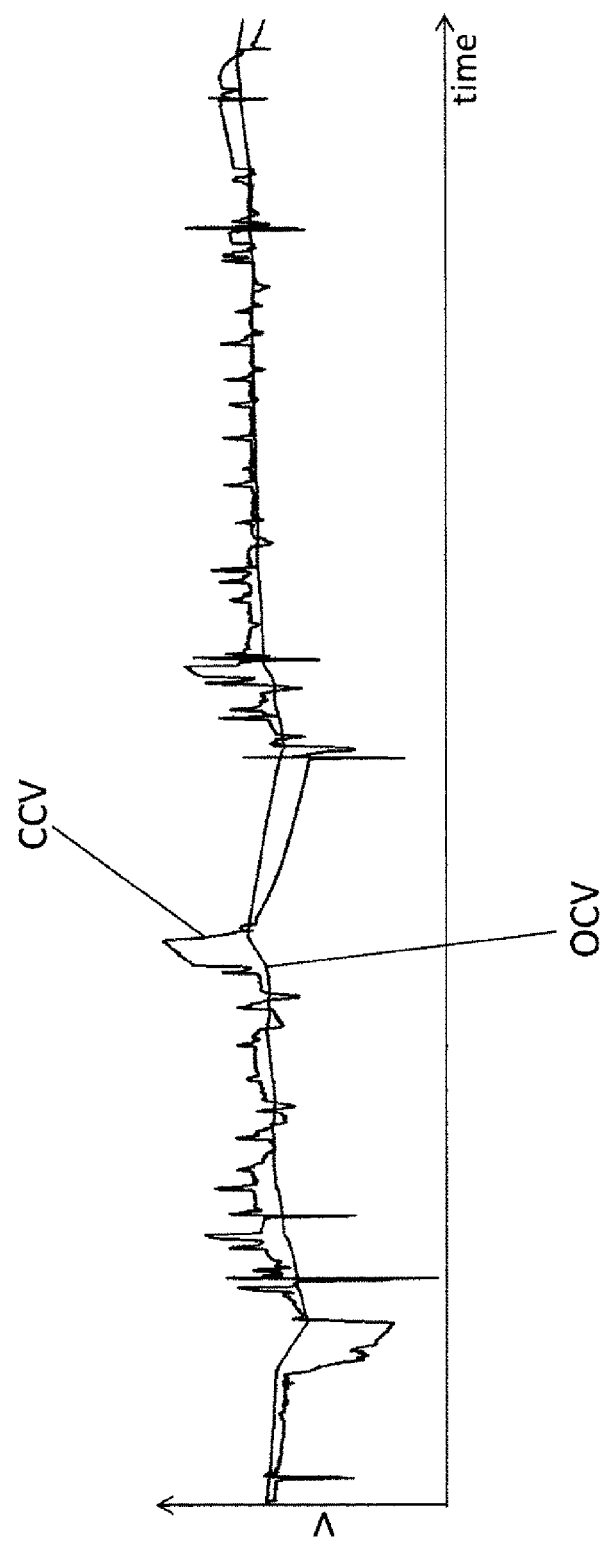
FIG. 6 is a diagram illustrating an example of CCV and OCV.

FIG. 6 illustrates behaviors of the OCV and the CCV which vary according to the charging or the discharging. It can be seen from FIG. 6 that the GCV and the CCV are almost not matched to each other.

Figure 7:
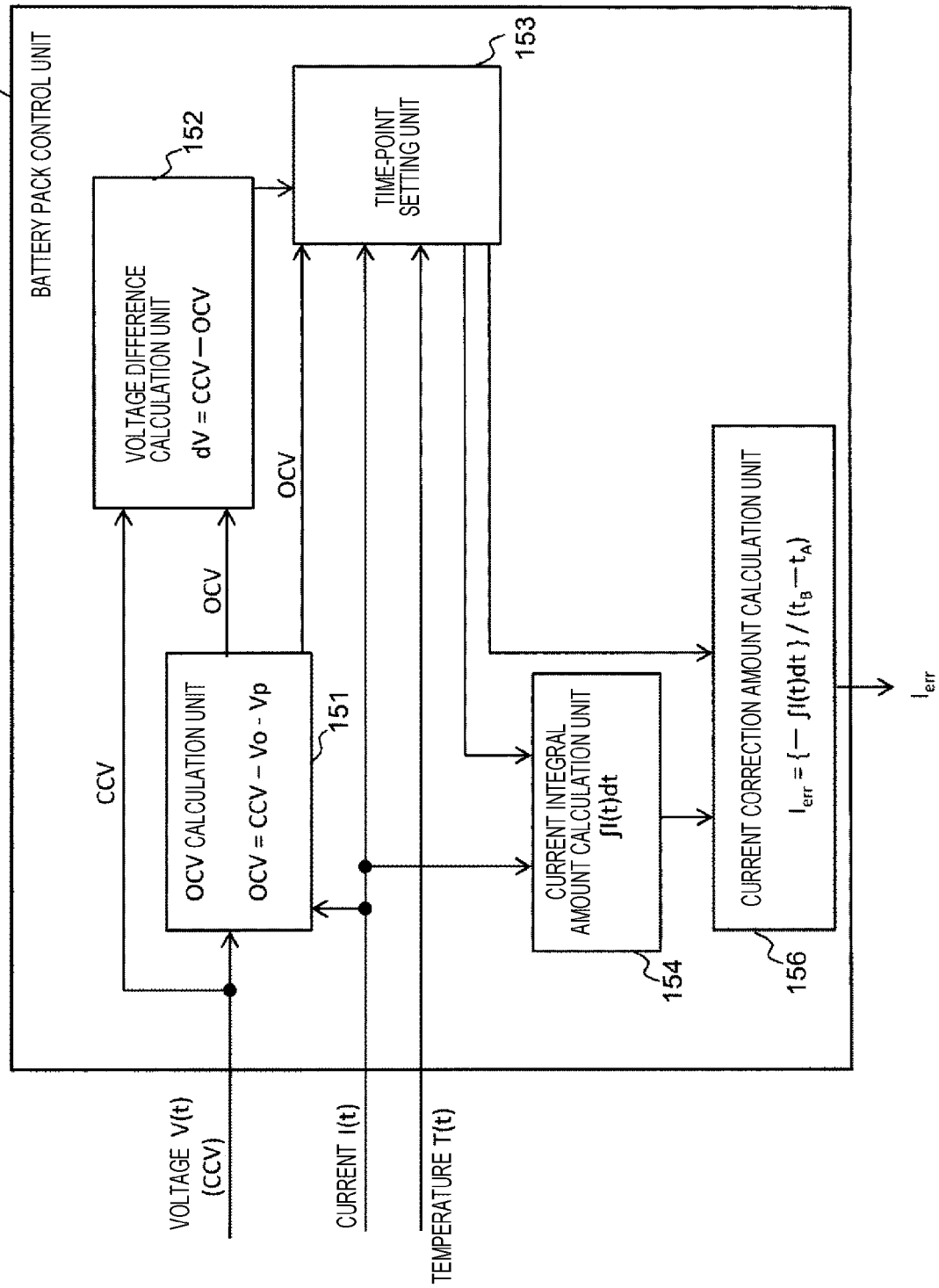
FIG. 7 is a diagram illustrating a current correction in a battery pack control unit of a first embodiment.

FIG. 7 is a functional block diagram illustrating a process of calculating various types of parameters such as the storage battery capacity of the secondary battery in the battery pack control unit 150. The battery pack control unit 150 includes an CCV calculation unit 151, a voltage difference calculation unit 152, a time-point setting unit 153, a current integral amount calculation unit 154, and a current correction amount calculation unit 156.

The battery pack control unit 150 obtains information of a current flowing from the current detection unit 130 to the battery pack 110 (that is, the detection current I(t) which is a charging or discharging current (charging/discharging current) of each cell 111).

The battery pack control unit 150 obtains information of the inter-terminal voltage of each cell 111 from the voltage detection unit 122. As described above, the inter-terminal voltage of each cell 111 is equal to the CCV, but not equal to the OCV in general. Therefore, the battery pack control unit 150 uses a voltage V(t) as the CCV as illustrated on the left side of the drawing.

Further, while not illustrated, the respective configurations of the battery pack control unit 150 can communicate with the storage unit 180 and the cell control units 121a and 121b as needed to obtain necessary information.

The OCV calculation unit 151 calculates the OCV on the basis of the voltage V(t) used as the CCV, the detection current I(t), the internal resistance Ro, the electrostatic capacitance C, internal resistance Rp, and the above-described Expression (1) (that is, OCV=CCV−Vo−Vp (1)), and outputs the calculated information to the voltage difference calculation unit 152 and the time-point setting unit 153. While not illustrated, the OCV calculation unit 151 communicates with the storage unit 180 to obtain the information of the internal resistance Ro, the electrostatic capacitance C, and the internal resistance Rp.

The voltage difference calculation unit 152 subtracts the OCV calculated by the OCV calculation unit 151 from the voltage V(t) used as the CCV to calculate a voltage difference (CCV−OCV), and outputs the voltage difference to the time-point setting unit 153. Further, the voltage difference (CCV−OCV) is denoted as a voltage difference dV.

The time-point setting unit 153 sets two time points at which the condition "the voltage difference dV is almost equal, and the OCV is also almost equal" is satisfied.

This reference is called as a first reference. The time-point setting unit 153 outputs the information at the setting time point to the current integral amount calculation unit 154 and the current correction amount calculation unit 156. Further, the time-point setting unit 153 can obtain even the information of the temperature T(t) according to the following reference.

The description will be given about the reason why the OCVs at the two setting points are almost equal. For the following explanation, CCV at a first time point is defined as CCVa, dV at the first time point as dVa, CCV at a second time point as CCVb, and dV at the second time point as dVb. Equivalent circuit equation of Battery: In a case where each term in OCV=CC−i·R−Vp contains an error err, First time point: OCVa=CCVa+Verr−(Ia+Ia_err)+(Ra+Ra_err)−(Vpa+Vpa_err), and Second time point: OCVb=CCVb+Verr−(Ib+Ib_err)+(Rb+Rb_err)−(Vpb+Vpb_err).

The first time point and the second time point are "two points at which the difference dV between the CCV and the OCV is almost equal". When the difference between the CCV and the OCV is set to dVa=dVb=X, the following relation is obtained.

$$dVa \text{ of the first time point}=CCVa-OCVa=Verr+(Ia+Ia\_err)+(Ra+Ra\_err)+(Vpa+Vpa\_err)=X$$

$$dVb \text{ of the second time point}=CCVb-OCVb=Verr+(Ib+Ib\_err)+(Rb+Rb\_err)+(Vpb+Vpb\_err)=X$$

$$\therefore OCVa=CCVa-dVa=CCVa-X$$

$$OCVb=CCVb-dVb=CCVb-X$$

$$\Delta SOC=f(OCVb)-f(OCVa)=f(CCVb-X)-f(CCVa-X).$$

When the function f can be approximated to a linear function indicated by f(y)=Ay+B, the following relation is obtained.

$$\Delta SOC \approx A(CCVb-X)+B-A(CCVa-X)-B=A(CCVb-CCVa)$$

Further, an error component is canceled to obtain ΔSOC with a high accuracy. Since ΔSOC is obtained at a high accuracy, two points having equal OCV can be set when ΔSOC=0.

From those described above, it is possible to increase the accuracy as much as the OCV at the time point satisfying the first reference, that is, the condition "the voltage difference dV is almost equal, and the OCV is also almost equal". Further, in addition to the first reference, second to sixth references described below may be contained as references for the time-point setting unit 153 to set the time points.

<Second Reference: Setting a Combination in Which the Behaviors of the Current at the First and Second Time Points are Similar>

In the OCV calculation unit 151, the internal resistances Ro and Rp of the cell 111 are used. The internal resistance of the battery varies depending on a condition such as a temperature, and also varies by a magnitude and a polarity of the current. In other words, the error contained in the internal resistance also varies by the magnitude and the polarity of the current. When the current values at a pair of time points are almost equal even in consideration of the polarity, the behavior of the current at each time point becomes equal. Therefore, the error of the internal resistance becomes almost equal, so that it is possible to alleviate the influence of the error of the internal resistance. In this reference, the time-point setting unit 153 sets a combination at a time point when an absolute value of the difference obtained by subtracting the current value flowing through the secondary battery at the second time point from the current value flowing through the secondary battery at the first time point is equal to or less than a predetermined value.

<Third Reference: Setting a Combination in Which the Absolute Values of Change Amounts of the Current at the First and Second Time Points are Equal To or Less Than a Predetermined Value>

There is a time difference between a time to detect the current detection unit 130 and a time to detect the voltage detection unit 122. The time difference does not cause trouble when a temporal variation of the detection current I(t) is small. However, when the temporal variation of the detection current I(t) is large, there occurs an error (referred to as an error in I-V synchronization) caused by a large deviation in the original value of a combination of the current I(t) contained in Vo (=I·R) of Expression (1) and the voltage V(t) used as the CCV. Therefore, a calculation accuracy of ΔSOC in an SOC difference calculation unit 155 is deteriorated, and the accuracy of a storage battery capacity Qmax is deteriorated. In this reference, the time-point setting unit 153 sets a combination in which the absolute values of change amounts of the current detected at the first time point and the current detected at the second time point are equal to or less than a predetermined value. Therefore, it is possible to select a time point at which the temporal variation of the current I(t) is small, an error of the I-V synchronization becomes small, and the accuracy of the storage battery capacity Qmax is improved.

<Fourth Reference: Setting a Combination in Which an Absolute Value of the Current at the First Time Point and an Absolute Value of the Current at the Second Time Point Each Become Equal To or Less Than a Predetermined Value>

In a case where the current of cell 111 is large, an error in a production of the detection current I(t) and the internal resistance Ro of the battery (that is, an IR error) is increased. The absolute value of the current at the first time point and the absolute value of the current at the second time point each become equal to or less than a predetermined value, so that the IR error can be made small. In this reference, the time-point setting unit 153 sets a combination in which the absolute value of the current flowing to the cell 111 at the first time point and the absolute value of the current flowing to the cell 111 at the second time point each become equal to or less than a predetermined value.

<Fifth Reference: Setting a Combination in Which a Time Interval From the First Time Point to the Second Time Point Becomes Equal to or More a Predetermined Value>

When an integration interval of a current integral amount ∫I(t) dt (that is, a time interval from the first time point to the second time point) is less than a predetermined value, an error which is caused in an error contained in the detection current I(t) and is contained in the current integral amount ∫I(t) dt is too small to detect. Therefore, it is possible to prevent the error from being detected by adding a condition that the time interval from the first time point to the second time point is equal to or more than a predetermined value. In this reference, the time-point setting unit 153 sets a combination in which the time interval from the first time point to the second time point becomes equal to or more than a predetermined value.

<Sixth Reference: Setting a Combination in Which the Temperature of the Cell 111 in the Time Interval From the First Time Point to the Second Time Point Falls Within a Predetermined Range>

With this reference, it is possible to prevent that the internal resistance is increased at a low temperature and the accuracy is deteriorated. In this reference, the time-point setting unit 153 sets a combination in which the temperature of the cell 111 in the time interval from the first time point to the second time point falls within a predetermined range.

The current integral amount calculation unit 154 calculates the current integral amount ∫I(t)dt which is an integral amount with time of the detection current I(t) in the time interval determined on the basis of a combination of the time points which are set by the time-point setting unit 153. The lower limit of the integration ∫I(t)dt is the first time point, and the upper limit is the second time point. The current integral amount calculation unit 154 outputs the current integral amount ∫I(t)dt thus calculated to the current correction amount calculation unit 156.

The current correction amount calculation unit 156 calculates the current error $I_{err}$ using the current integral amount ∫I(t)dt, a time $(t_B-t_A)$ from the first time point to the second time point, and the following Expression (2).

$$I_{err} = \{-\int I(t)dt\}/(t_B-t_A) \quad (2)$$

The calculated current error is used as the current correction amount $I_{err}$, and output to the current correction unit 131 of the current detection unit 130 illustrated in FIG. 2.

Herein, the principle of obtaining the current error using Expression (2) will be described. The detection current I(t) is configured by the current true value $I_{gen}$ and the current error $I_{err}$ as shown in the following Expression (3)

$$I(t) = I_{gen} + I_{err} \quad (3)$$

Since the first time point and the second time point are equal in the OCV, the current integral amount ∫I(t) dt becomes zero as shown in the following Expression (4).

$$\int I(t)dt = \int (I+I_{err})dt = \int Idt + I_{err} \cdot (t_B-t_A) = 0 \quad (4)$$

Therefore, Expression (2) can be obtained by deforming Expression (4) using the third and fourth terms.

The current correction unit 131 of the current detection unit 130 calculates the current true value $I_{gen}$ using the detection current I(t), the current correction amount $I_{err}$, and the following Expression (5).

$$I_{gen} = I(t) - I_{err} \quad (5)$$

Therefore, it is possible to obtain the information of the current with a high accuracy. Since the current detection unit 130 outputs the current true value $I_{gen}$ to the battery pack control unit 150, the battery pack control unit 150 can perform a highly-accurate control on the basis of the current true value $I_{gen}$. In addition, the current detection unit 130 outputs also the detection current I(t) to the battery pack control unit 150 to make the battery pack control unit 150 enable to obtain the current correction amount $I_{err}$ even at a later time.

The battery control device of this embodiment has the following configuration, and achieves the following operational effect.

(1) The battery control device 120 includes the time-point setting unit 153 which calculates the voltage difference dV obtained by subtracting the calculated open-circuit voltage OCV from the measured closed-circuit voltage CCV, and sets the first and second time points at which the absolute value of the voltage difference dV becomes equal to or less than a predetermined value and the absolute value of a difference of the open-circuit voltage OCV becomes equal or less than a predetermined value. Such a condition corresponds to the first reference described above. The battery control device 120 further includes the current integral amount calculation unit 154 to obtain the current integral amount ∫I(t) which is an integral amount with time of the current flowing through the cell 111 from the first time point to the second time point, the current correction amount calculation unit 156 which calculates the current error contained in a detection signal output by the current detection unit and sets the current error as the current correction amount on the basis of the current integral amount and a time from the first time point to the second time point, and the current correction unit 131 which corrects the detection signal using the current correction amount.

With this configuration, the current correction amount $I_{err}$ can be calculated with a high accuracy. As a result, the detection current I(t) can be corrected with a high accuracy, and a highly-accurate current true value $I_{gen}$ can be obtained.

(2) The time-point setting unit 153 sets the first time point $t_A$ and the second time point $t_B$ on the basis of the second reference. In other words, the time-point setting unit 153 sets the first time point $t_A$, and the second time point $t_B$ to make the current value flowing through the secondary battery at the first time point $t_A$ and the current value flowing through the cell 111 at the second time point $t_B$ become almost equal. Therefore, it is possible to alleviate the influence of the error of the internal resistance, and the current correction amount $I_{err}$ can be calculated with a high accuracy.

(3) The time-point setting unit 153 sets the first time point $t_A$ and the second time point $t_B$ on the basis of the third reference. In other words, the time-point setting unit 153 sets the first time point $t_A$ and the second time point $t_B$ such that the absolute value of the temporal variation amount of the current flowing through the secondary battery at the first time point $t_A$ and the absolute value of the temporal variation amount of the current flowing through the secondary battery at the second time point $t_B$ become equal to or less than a predetermined value.

Therefore, it is possible to alleviate the influence of the error of the I-V synchronization, and the current correction amount $I_{err}$ can be calculated with a high accuracy.

(4) The time-point setting unit 153 sets the first time point $t_A$ and the second time point $t_B$ on the basis of the fourth reference. In other words, the time-point setting unit 153 sets the first time point $t_A$ and the second time point $t_B$ such that the absolute value of the current flowing through the secondary battery at the first time point $t_A$ and the absolute value of the current flowing through the secondary battery at the second time point $t_B$ become equal to or less than a predetermined value.

Therefore, it is possible to alleviate the influence of the IR error, and the current correction amount $I_{err}$ can be calculated with a high accuracy.

(5) The time-point setting unit 153 sets the first time point $t_A$ and the second time point $t_B$ on the basis of the fifth reference. In other words, the time-point setting unit 153 sets the first time point $t_A$ and the second time point $t_B$ such that a time from the first time point $t_A$ to the second time point $t_B$ becomes equal to or more than a predetermined value.

Therefore, it is possible to prevent an erroneous detection since an error (integral error) contained in the current integral amount $\int I(t)dt$ is small enough, and the current correction amount $I_{err}$ can be calculated with a high accuracy.

(6) The time-point setting unit 153 sets the first time point $t_A$ and the second time point $t_B$ on the basis of the sixth reference. In other words, the time-point setting unit 153 sets the first time point $t_A$ and the second time point $t_B$ such that the temperature of the cell 111 during a period from the first time point $t_A$ to the second time point $t_B$ falls within a predetermined range.

Therefore, it is possible to prevent that the internal resistance is increased at a low temperature and the accuracy is alleviated, and the current correction amount $I_{err}$ can be calculated with a high accuracy.

—Second Embodiment—

While the first embodiment has been described such that two points having almost the equal OCVs are set, in a second embodiment, the time-point setting unit 153 can be set two points even when the OCVs are largely deviated. Further, the same configurations as those of the first embodiment will be omitted from the explanation of the second embodiment.

Figure 8:
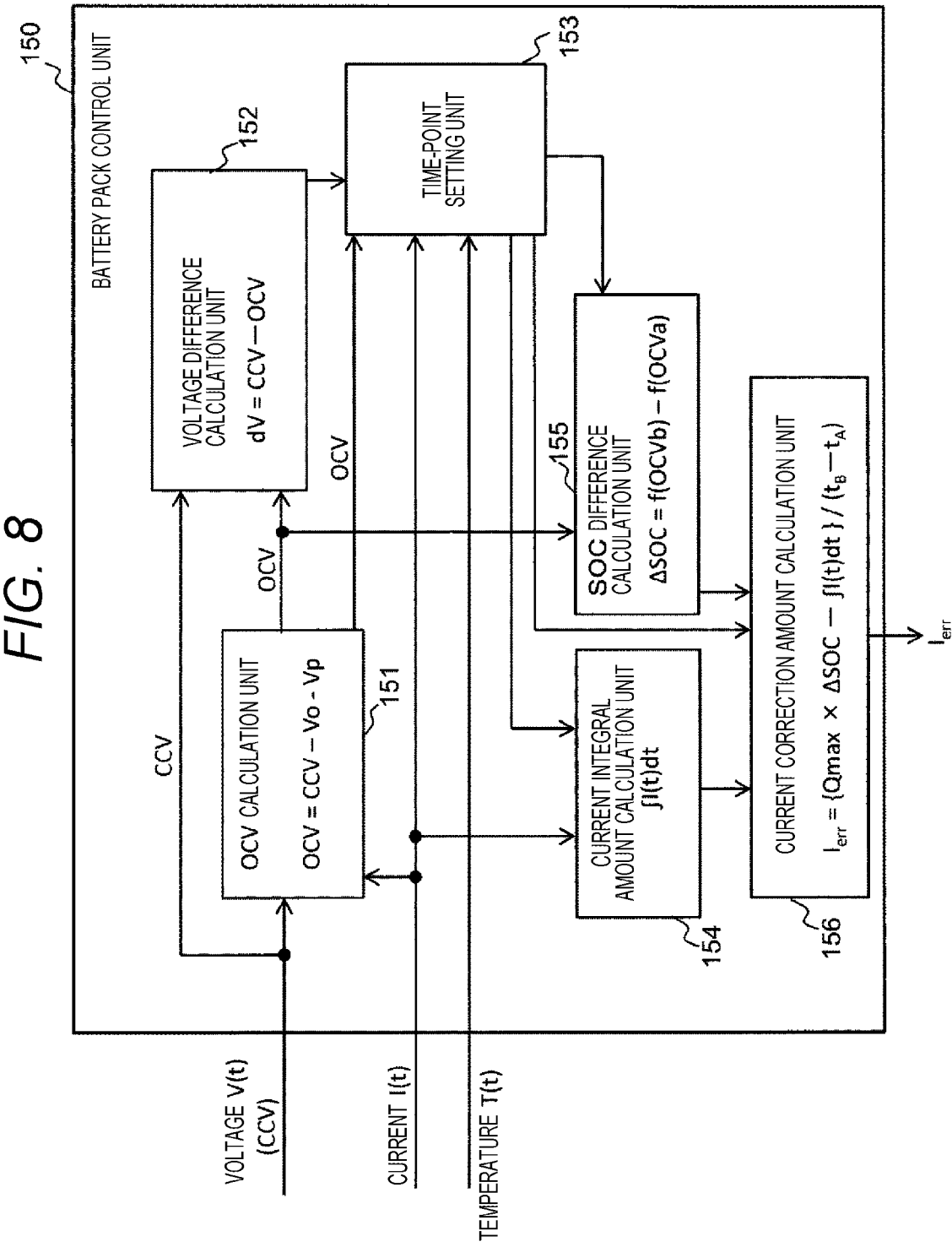
FIG. 8 is a diagram illustrating a current correction in a battery pack control unit of a second embodiment.

FIG. 8 is a diagram illustrating the battery pack control unit 150 in the second embodiment. The second embodiment is mainly different from the first embodiment as follows.

The setting criteria of the first and second time points of the time-point setting unit 153 is alleviated.

The calculation expression of current correction amount calculation unit 156 is changed.

With the change in the above expression, an SOC difference is required, and the SOC difference calculation unit 155 is provided.

With the change in the above expression, the storage battery capacity is required.

Therefore, the description will be given focusing on the differences.

The time-point setting unit 153 sets a time point at which "the voltage difference dV is almost equal" is satisfied. This condition is referred to as a seventh reference. With the seventh reference, the condition related to the OCV is not necessary unlike the first reference. In other words, the OCV at the first time point and the OCV at the second time point may be equal, or may not.

Since the setting of the time point of the time-point setting unit 153 is alleviated, the current correction amount calculation unit 156 calculates the current correction amount $I_{err}$ using the following Expression (6).

$$I_{err} = \{Qmax \times \Delta SOC - \int I(t)dt\}/(t_B - t_A) \quad (6)$$

The current correction amount calculation unit 156 calculates the current correction amount $I_{err}$ using Expression (6), and outputs the calculated amount to the current correction unit 131 of the current detection unit 130 illustrated in FIG. 2.

In order to calculate the current correction amount $I_{err}$ in the above Expression (6), $\Delta SOC$ (SOC difference) and the storage battery capacity Qmax are necessary.

In this embodiment, the SOC difference calculation unit 155 is provided to obtain $\Delta SOC$.

The SOC difference calculation unit 155 determines a combination with respect to a plurality of collected time points, and obtains $\Delta SOC$ in each combination on the basis of the following Expression (7).

$$\Delta SOC = f(OCVb) - f(OCVa) \quad (7)$$

The SOC difference calculation unit 155 outputs $\Delta SOC$ related to the combination at each time point to the current correction amount calculation unit 156.

Herein, the OCVa is the OCV at the first time point, and the OCVb is the OCV at the second time point. The second time point becomes a time point after the first time point. The function f is a function indicating a relation between the OCV and the SOC, and stored in the storage unit 180 in advance. The SOC difference calculation unit 155 communicates with the storage unit 180, and obtains the function f. Further, since the function f also depends on a temperature, the SOC difference calculation unit 155 may obtain the temperature information of the cell 111 from the cell control units 121a and 121b and corrects the function f, and applies the function to Expression (7) in order to obtain $\Delta SOC$ with accuracy.

The current correction amount calculation unit 156 communicates with the storage unit 180 to perform the calculation of Expression (6), and obtains the information of the storage battery capacity Qmax of the cell 111 stored in the storage unit 180 in advance.

The battery control device of this embodiment has the following configuration, and achieves the following operational effect.

The battery control device 120 includes the time-point setting unit 153 which sets the first time point $t_A$ equipped with a first voltage difference dVa which is a difference obtained by subtracting a first open-circuit voltage OCV from a first closed-circuit voltage CCV, and the second time point $t_B$ equipped with a second voltage difference dVb which is a difference obtained by subtracting a second open-circuit voltage OCV from a second closed-circuit voltage CCV and in which the absolute value of the difference with respect to the first voltage difference becomes equal to or less than a predetermined value.

When the time-point setting unit 153 sets the first time point $t_A$ and the second time point $t_B$, the first open-circuit voltage OCV and the second open-circuit voltage OCV may be equal to each other, or not.

in other words, the time-point setting unit 153 follows the seventh reference.

Therefore, the battery control device 120 includes the SOC difference calculation unit 155 which obtains the SOC difference between the SOC at the first time point and the SOC at the second time point, and the current correction amount calculation unit 156 which calculates a current error contained in the current output by the current detection unit on the basis of the storage battery capacity, the SOC difference, the current integral amount, and a time from the first time point to the second time point and outputs the current error as the current correction amount.

With this configuration, the current correction amount can be calculated with a high accuracy. As a result, the detection current I(t) can be corrected with a high accuracy, and a highly-accurate current true value $I_{gen}$ can be obtained.

—Modification of Second Embodiment—

The time-point setting unit 153 may further include an eighth reference as a setting reference besides the seventh reference.

<Eighth Reference: Setting a Combination Having a Small $\Delta SOC$>

In the above Expression (6), a production of the storage battery capacity Qmax and $\Delta SOC$ is contained. When two points having a small absolute value of $\Delta SOC$ are selected, it is possible to reduce an error contained in the storage battery capacity Qmax.

—Third Embodiment—

In this embodiment, the vehicle system control unit 200 can communicate with the time-point setting unit 153 of the battery pack control unit 150. The description of the same configurations as those of the first embodiment will be omitted.

In this embodiment, the vehicle system control unit 200 has an EV driving mode in which the drive system is driven by the motor generator 410 without using the engine 710, and an HEV driving mode in which the drive system is driven by the engine 710 and the motor generator 410.

Basically, the time-point setting unit 153 desirably sets a time point at which the OCVs are almost equal to each other. Therefore, in a situation where a time point having an equal OCV is not obtained, the vehicle system control unit 200 actively performs the control to make a time point having an equal OCV. For example, since the OCV of the cell Ill monotonously decreases in the EV driving mode, it is difficult to obtain a time point having an equal OCV if a regenerative current does not flow. In such a case, the vehicle system control unit 200 switches a mode to the HEV driving mode. Therefore, it is possible to make a time point having an equal OCV, and a chance to calculate the current correction amount $I_{err}$ can be increased.

—Fourth Embodiment—

In this embodiment, the vehicle system control unit 200 can communicate with the time-point setting unit 153 of the battery pack control unit 150. The description of the same configurations as those of the first embodiment will be omitted.

In this embodiment, the vehicle system control unit 200 has an EV driving mode in which the drive system is driven by the motor generator 410 without using the engine 710, and an REV driving mode in which the drive system is driven by the engine 710 and the motor generator 410.

It is desirable that the time-point setting unit 153 set a time point particularly in a case where the current correction is performed. Therefore, in a case where the current correction is performed, the vehicle system control unit 200 actively performs the control to make a time point having an equal OCV. For example, since the current does not flow to the cell 111 immediately after the vehicle system 500 starts to run, the erroneous current is corrected at this time point. Therefore, the current error $I_{err}$ of the detection current I(t) of the current detection unit 130 is small immediately after the vehicle system 500 starts to run. However, the current flows to the cell 111 to drive the drive system 600 after the vehicle system 500 starts to run and a certain time elapses. Therefore, the current error $I_{err}$ of the detection current I(t) becomes large, and the current correction is especially required. For this reason, the vehicle system control unit 200 increases a ratio of the HEV driving mode after the vehicle system 500 starts to run and a certain time elapses. Therefore, it is possible to make a time point having an equal OCV, and a chance to calculate the current correction amount $I_{err}$ can be increased.

—Modification of the Third and Fourth Embodiments—

In the third and fourth embodiments, in a case where a time point having an equal OCV is made, the vehicle system control unit 200 actively controls the respective configurations, or may perform the control in other way. For example, the time-point setting unit 153 of the battery control device 120 may communicate with the vehicle system control unit 200 to issue a command (signal S5 of FIG. 1) to the vehicle system control unit 200 to make a time point having an equal OCV.

—Modification of a Calculation Method of the Current Error—

A plurality of current correction amounts $I_{err}$ are used to take an average, and the current may be corrected using an average current correction amount. At this time, the current correction unit 131 desirably performs the current correction by performing a weighted average calculation using the plurality of current correction amounts $I_{err}$ calculated by the current correction amount calculation unit 156 to obtain the average current correction amount. A weight in the weighted average calculation may be assigned according to an error in each of the plurality of current correction amounts $I_{err}$. Each weight with respect to the error of each of the plurality of current correction amounts $I_{err}$ is determined according to factors such as a magnitude of the current, a variation amount of the current, and a temperature of the cell 111 in the time interval from the first time point to the second time point.

—Modification of a Current Correction Method—

Figure 9:
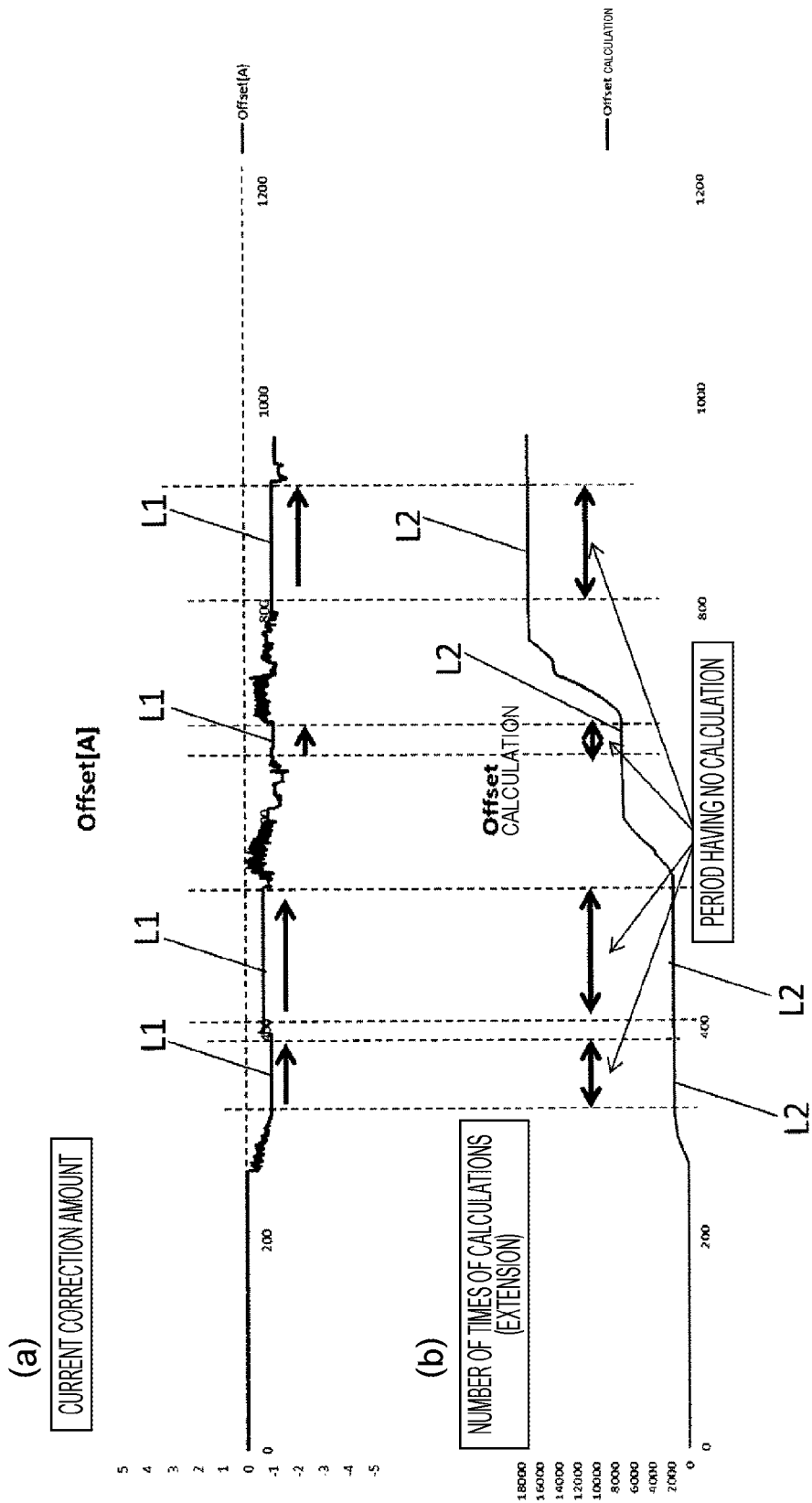
FIG. 9 is a diagram illustrating a current correction method (Part 1).

This modification is about a current correction method. FIG. 9 illustrates a typical current correction method in which the current correction amount $I_{err}$ does not temporally vary, but the current correction amount $I_{err}$ is subtracted from the detection current I(t). FIG. 9(a) illustrates the current correction amount. FIG. 9(b) illustrates the number of times of calculating the current correction amount $I_{err}$. In an area L2 where the number of times of calculations illustrated in FIG. 9(b) is flat with respect to time, the calculation of the current correction amount $I_{err}$ is not performed. In other words, this means that the current correction amount $I_{err}$ is not updated. Then, in the correction method illustrated in FIG. 9, in a case where the detection current I(t) is corrected by the current correction amount $I_{err}$, the current correction amount $I_{err}$ does not temporally vary, but the current correction amount $I_{err}$ is subtracted from the detection current I(t) as illustrated in an area L1 of FIG. 9(a). However, the current error $I_{err}$ varies as the time goes. Therefore, when the current correction is kept while keeping the current correction amount $I_{err}$ constant without updating the current correction amount $I_{err}$, there is a possibility that the correction is not suitable to a real situation.

Therefore, in this modification, the current correction unit 131 of the current detection unit 130 attenuates the current correction amount $I_{err}$, and corrects the detection current I(t) using the attenuated current correction amount $I_{err}$.

Figure 10:
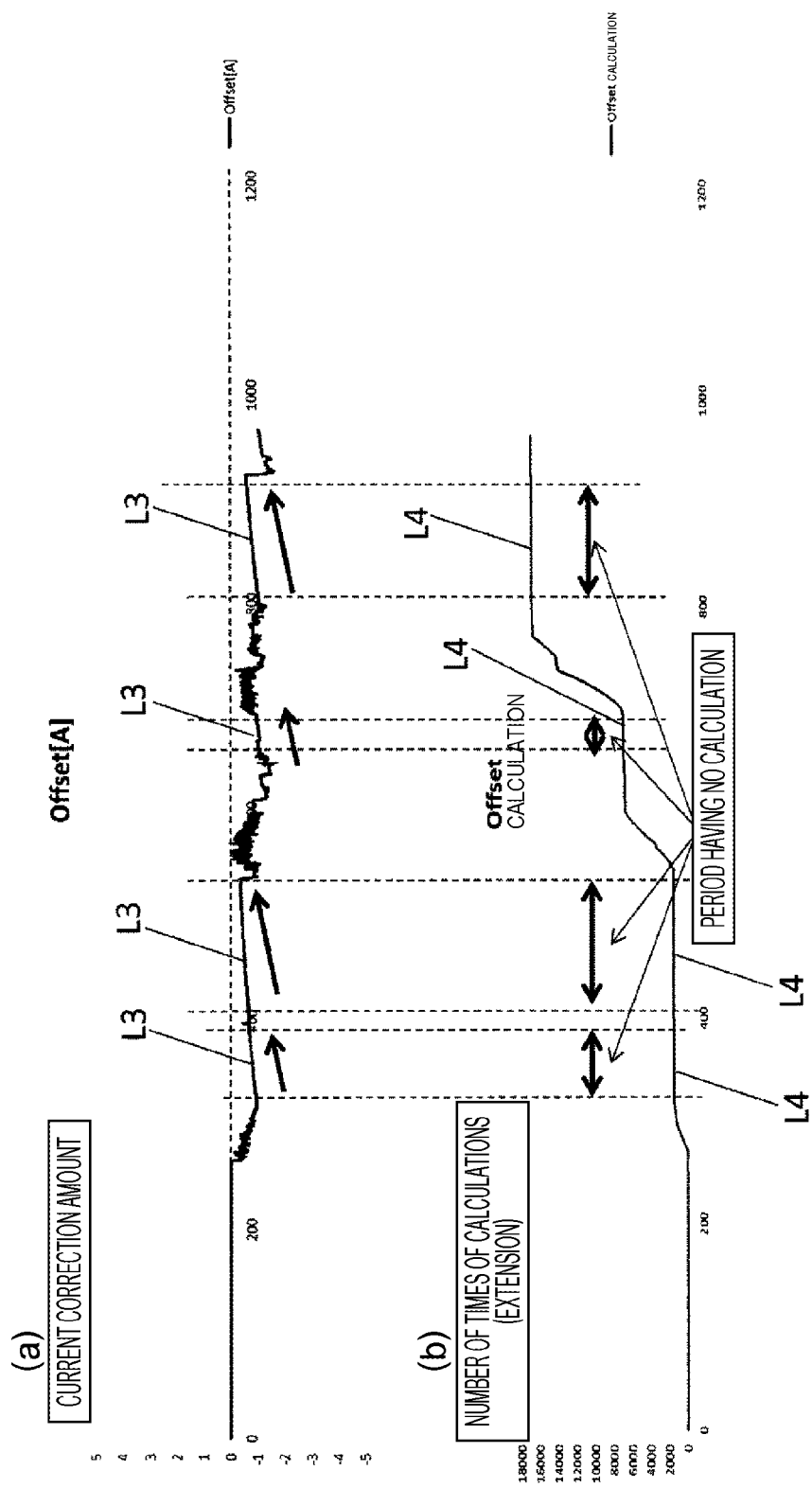
FIG. 10 is a diagram illustrating the current correction method (Part 2).

FIG. 10 illustrates a correction method in which the current correction amount $I_{err}$ is attenuated. FIG. 10(a) illustrates the current correction amount. FIG. 10(b) illustrates the number of times of calculating the current correction amount $I_{err}$. In an area L4 where the number of times of calculations illustrated in FIG. 10(b) is flat with respect to time, the calculation of the current correction amount $I_{err}$ is not performed, and the current correction amount $I_{err}$ is not updated. Unlike FIG. 9(a), the current correction amount $I_{err}$ is attenuated in FIG. 10(a) as illustrated in an area L3. The detection current I(t) is corrected using the attenuated current correction amount $I_{err}$. Therefore, it is possible to prevent that the correction is not suitable to a real situation due to not able to update the current correction amount $I_{err}$.

The invention is not limited to the content mentioned above. Other aspects which may be considered as falling within technical ideas of the invention are included in the scope of the invention.

REFERENCE SIGNS LIST

100 battery system
110 battery pack 111 cell
112 cell group
112a cell group
112b cell Group
120 battery control device
121a cell control unit
121b cell control unit
122 voltage detection unit
123 control circuit
124 signal input/output circuit
125 temperature detection unit
130 current detection unit
131 current correction unit
140 voltage detection unit
150 battery pack control unit
151 OCV calculation unit
152 voltage difference calculation unit
153 time-point setting unit
154 current integral amount calculation unit
155 SOC difference calculation unit
156 current correction amount calculation unit
160 signal channel
170 insulating element
180 storage unit
200 vehicle system control unit
250 input unit
300 relay
320 relay
400 inverter
410 motor generator
420 charger
500 vehicle system
600 drive system
700 engine control device
710 engine
dV voltage difference
dVa first voltage difference
dVb second voltage difference
$I_{err}$ current correction amount (current error)
$I_{gen}$ current true value
Qmax storage battery capacity
$t_A$ first time point
$t_B$ second time point

The invention claimed is:

1. A battery control device, comprising:
a current sensor that detects a current flowing through a secondary battery;
a closed-circuit voltage sensor that detects an inter-terminal voltage of the secondary battery to acquire a closed-circuit voltage; and
a controller that is communicatively coupled to the current sensor and the close circuit voltage sensor, wherein the controller is configured to:
calculate an open-circuit voltage based on the closed circuit voltage;
calculate voltage difference obtained by subtracting the open-circuit voltage from the closed-circuit voltage,
set a first time point and a second time point at which an absolute value of the voltage difference is equal to or less than a predetermined value and an absolute value of a difference of the open-circuit voltage becomes equal to or less than a predetermined value,
determine a current integral amount, wherein the current integral amount is a time integral amount of a current flowing through the secondary battery between the first time point and the second time point,
calculate a current error based on the current integral amount and a time from the first time point to the second time point,
set the current error as a current correction amount; and
generates a detection signal using the current correction amount, wherein the detection signal indicates a State of Charge (SOC) of the secondary battery.

2. The battery control device according to claim 1, wherein:
the controller is further configured to calculate an SOC difference between an SOC at the first time point and an SOC at the second time point;
the current correction amount is further based on the SOC difference.

3. The battery control device according to claim 2, wherein the controller further calculates each SOC based on the open-circuit voltage, and sets the first and second time points at which an absolute value of the SOC difference is equal to or less than a predetermined value.

4. The battery control device according to claim 1, wherein the controller further:
attenuates the current error as time elapses during a period when the current error is not calculated by the controller so as to correct the current.

5. The battery control device according to claim 1, wherein the controller calculates a difference in a current value flowing through the secondary battery, and sets the first and second time points at which an absolute value of the difference of the current value is equal to or less than a predetermined value.

6. The battery control device according to claim 1, wherein the controller further calculates a temporal variation amount of the current flowing through the secondary battery, and sets the first and second time points at which an absolute value of the temporal variation amount of the current flowing through the secondary battery is equal to or less than a predetermined value.

7. The battery control device according to claim 1, wherein the controller further calculates an absolute value of the current flowing through the secondary battery, and sets the first and second time points at which an absolute value of the current flowing through the secondary battery is equal to or less than a predetermined value.

8. The battery control device according to claim 1, wherein the controller further sets the first and second time points at which a time interval becomes equal to or more than a predetermined value.

9. The battery control device according to claim 1, wherein the controller further sets the first time point and the second time point when a temperature of the secondary battery falls within a predetermined range.

10. The battery control device according to claim 1, wherein the controller further:
calculates the current correction amount of a plurality of time periods to for a set of current measurements,
performs a weighted average using the set of current measurements to obtain an average current correction amount, and corrects the current using the average current correction amount, and
wherein a weight in the weighted average is assigned according to an error of each measurement calculated in the set of current measurements.

11. The battery control device according to claim 1, wherein the battery control device is mounted in a vehicle system, wherein the vehicle system is provided with an engine, a motor generator that is driven by power from the secondary battery at the time of powering, and generates regenerative electric power to charge the secondary battery at the time of regenerating, and a system control unit that controls at least the engine and the motor generator;

wherein the engine and the motor generator comprise a drive system, and wherein the system control unit includes an Electric Vehicle (EV) driving mode in which the drive system is driven by the motor generator without using the engine, and a Hybrid Electric Vehicle (HEV) driving mode in which the drive system is driven by the engine and the motor generator.

12. The battery control device according to claim 11, further comprising:
a command unit that outputs a command to the system control unit to switch a driving mode to the HEV driving mode in a case where a chance to calculate the current correction amount is equal to or less than a predetermined number of times in the EV driving mode.

13. The battery control device according to claim 11, further comprising:
a command unit that outputs a command to the system control unit to increase a ratio of HEV running after the vehicle system starts to run and a predetermined period elapses.

14. A vehicle system, comprising:
an engine;
a motor generator that is driven by power from the secondary battery at the time of powering, and generates regenerative electric power to charge the secondary battery at the time of regenerating;
the battery control device according to claim 1; and
a system control unit that controls at least the engine and the motor generator,
wherein the engine and the motor generator comprise a drive system, and
wherein the system control unit includes an Electric Vehicle (EV) driving mode in which the drive system is driven by the motor generator without using the engine, and an Hybrid Electric Vehicle (HEV) driving mode in which the drive system is driven by the engine and the motor generator.

15. The vehicle system according to claim 14,
wherein the system control unit switches a driving mode to the HEV driving mode in a case where a chance to calculate the current correction amount is equal to or less than a predetermined number of times in the EV driving mode.

16. The vehicle system according to claim 14,
wherein the system control unit increases a ratio of the HEV driving mode after the vehicle system starts to run and a predetermined period elapses.

* * * * *